United States Patent [19]
Beers et al.

[11] Patent Number: 5,257,714
[45] Date of Patent: Nov. 2, 1993

[54] METHOD AND APPARATUS FOR ELECTRONIC COMPONENT LEAD INSPECTION

[75] Inventors: Gregory E. Beers; Francis W. Bogaczyk; Michael A. Rubsam, all of Austin; Henry E. Wattenbarger, Pflugerville, all of Tex.

[73] Assignee: International Business Machines Corporation, Armonk, N.Y.

[21] Appl. No.: 928,672

[22] Filed: Aug. 12, 1992

Related U.S. Application Data

[63] Continuation of Ser. No. 616,287, Nov. 20, 1990, abandoned.

[51] Int. Cl.$^5$ .............................................. B23K 37/04
[52] U.S. Cl. ....................................... 228/6.2; 228/105
[58] Field of Search ............... 228/105, 103, 6.2, 44.7, 228/180.2, 9

[56] References Cited

U.S. PATENT DOCUMENTS

| | | | |
|---|---|---|---|
| 3,641,648 | 2/1972 | Kalberman | 228/6.2 |
| 3,713,575 | 1/1973 | Cushman | 228/6.2 |
| 4,604,648 | 8/1986 | Kley | |
| 4,675,993 | 6/1987 | Harada | 228/105 |
| 4,677,473 | 6/1987 | Okamoto et al. | 228/105 |
| 4,728,195 | 3/1988 | Silver | |
| 4,813,588 | 3/1989 | Srivastava | 228/103 |
| 4,848,639 | 7/1989 | Belanger, Jr. | 228/5.5 |
| 4,970,380 | 11/1990 | Miller | 369/116 |
| 5,033,665 | 7/1991 | Todd | 228/105 |

FOREIGN PATENT DOCUMENTS

| | | | |
|---|---|---|---|
| 0020345 | 1/1986 | Japan | 228/105 |
| 61-280628 | 5/1987 | Japan | |
| 63-005243 | 6/1988 | Japan | |

OTHER PUBLICATIONS

IBM Technical Disclosure Bulletin, vol. 30, No. 4, Sep. 1987, pp. 1506-1508, "Optical Inspection/Alignment of Multisides Component Connections".
IBM Bulletin, vol. 32 No. 11 Apr. 1990. Illuminator for integrated circuits, pp. 459-461.
IBM Bulletin, vol. 28 No. 11 Apr. 1986. Chip-Orientation detector, 5083-5084.
IBM Bulletin, vol. 22 No. 9 Feb. 1980. Inspection Technique for Solder Reflow Pad, p. 4068.
IBM Bulletin, vol. 31 No. 10 Mar. 1989 Assembly Technique for Placing Electronic Components, pp. 222-228.

*Primary Examiner*—Mark Rosenbaum
*Assistant Examiner*—James Miner
*Attorney, Agent, or Firm*—Andrew J. Dillon

[57] ABSTRACT

The method and apparatus of the present invention permit the visual inspection of electronic component leads during the mounting thereof. A hot bar thermode or other mounting tool is provided having a plurality of thermally activatable blades. A vacuum chuck and associated vacuum pump are utilized to selectively mount an integrated circuit device such that the conductive leads of the device are disposed adjacent to the lower surfaces of the thermally activatable blades. A low angle light source is then utilized to illuminate the integrated circuit device conductive leads such that a high contrast is created between the conductive leads and the lower surface of the thermally activatable blades, in order to permit an accurate visual inspection of the conductive leads. In one embodiment of the present invention, the lower surfaces of the thermally activatable blades are given a uniform grain by lapping those surfaces in a single direction to minimize the specularity of these surfaces and the angle of illumination is adjusted to enhance the contrast between the conductive leads and the lower blade surfaces. A camera disposed below the hot bar thermode may then be utilized to permit remote visual inspection of the conductive leads of an integrated circuit device while it is present within the mounting tool.

10 Claims, 3 Drawing Sheets

METHOD AND APPARATUS FOR ELECTRONIC COMPONENT LEAD INSPECTION

This application is a continuation, of application Ser. No. 616,287, filed Nov. 20, 1990, now abandoned.

BACKGROUND OF THE INVENTION

1. Technical Field

The present invention relates in general to the field of integrated circuit device assembly and inspection and in particular to systems and methods for the inspection of integrated circuit device conductive leads. Still more particularly, the present invention relates to the field of visual inspection of integrated circuit device conductive leads during the mounting thereof.

2. Description of the Related Art

The increasing complexity of electronic systems along with a concomitant increase in packaging densities has resulted in an increased utilization of automated device handling. Modern robotic systems are often utilized to assemble electronic systems and bring an increased reliability to highly repetitive operations, such as integrated circuit device mounting and placement. Often an integrated circuit device is picked up by a robotic arm and placed on a circuit board to be temporarily held in place by a tacky substance, such as flux. Subsequently, a hot bar thermode, or other similar device is utilized to permanently bond the device to the circuit board.

Despite the increased efficiency and accuracy of robotic systems in placing and mounting integrated circuit devices on circuit boards, it is still necessary to inspect each integrated circuit device prior to mounting the device to ensure that the device is in a proper orientation and that all conductive leads are present and properly oriented to ensure proper conductive mounting. In the prior art this is often accomplished by utilizing optical inspection techniques prior to placing each integrated circuit device at a mounting location; however, these systems require each integrated circuit device to be moved into an inspection area, inspected, and then moved again to the mounting position.

Experience with such systems has shown that it is likely that an integrated circuit device may be damaged after inspection during the process of transporting that device to a mounting point. It should therefore be apparent that a need exists for a method and apparatus which permits an integrated circuit device to be inspected prior to mounting the device without requiring unnecessary handling of the device. One problem which must be overcome in such a system is the difficulty which is encountered in attempting to optically inspect an integrated circuit device while such a device is present within a mounting tool.

SUMMARY OF THE INVENTION

It is therefore one object of the present invention to provide an improved integrated circuit device inspection and assembly system.

It is another object of the present invention to provide an improved integrated circuit device inspection and assembly system which permits the accurate optical inspection of integrated circuit device leads.

It is yet another object of the present invention to provide an improved integrated circuit device inspection and assembly system which permits a visual inspection of an integrated circuit device conductive leads during the mounting thereof.

The foregoing objects are achieved as is now described. The method and apparatus of the present invention permit the visual inspection of electronic component leads during the mounting thereof. A hot bar thermode or other mounting tool is provided having a plurality of thermally activatable blades. A vacuum chuck and associated vacuum pump are utilized to selectively mount an integrated circuit device such that the conductive leads of the device are disposed adjacent to the lower surfaces of the thermally activatable blades. A low angle light source is then utilized to illuminate the integrated circuit device conductive leads such that a high contrast is created between the conductive leads and the lower surface of the thermally activatable blades, in order to permit an accurate visual inspection of the conductive leads. In one embodiment of the present invention, the lower surfaces of the thermally activatable blades are given a uniform grain by lapping those surfaces in a single direction to minimize the specularity of these surfaces and the angle of illumination is adjusted to enhance the contrast between the conductive leads and the lower blade surfaces. A camera disposed below the hot bar thermode may then be utilized to permit remote visual inspection of the conductive leads of an integrated circuit device while it is present within the mounting tool.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
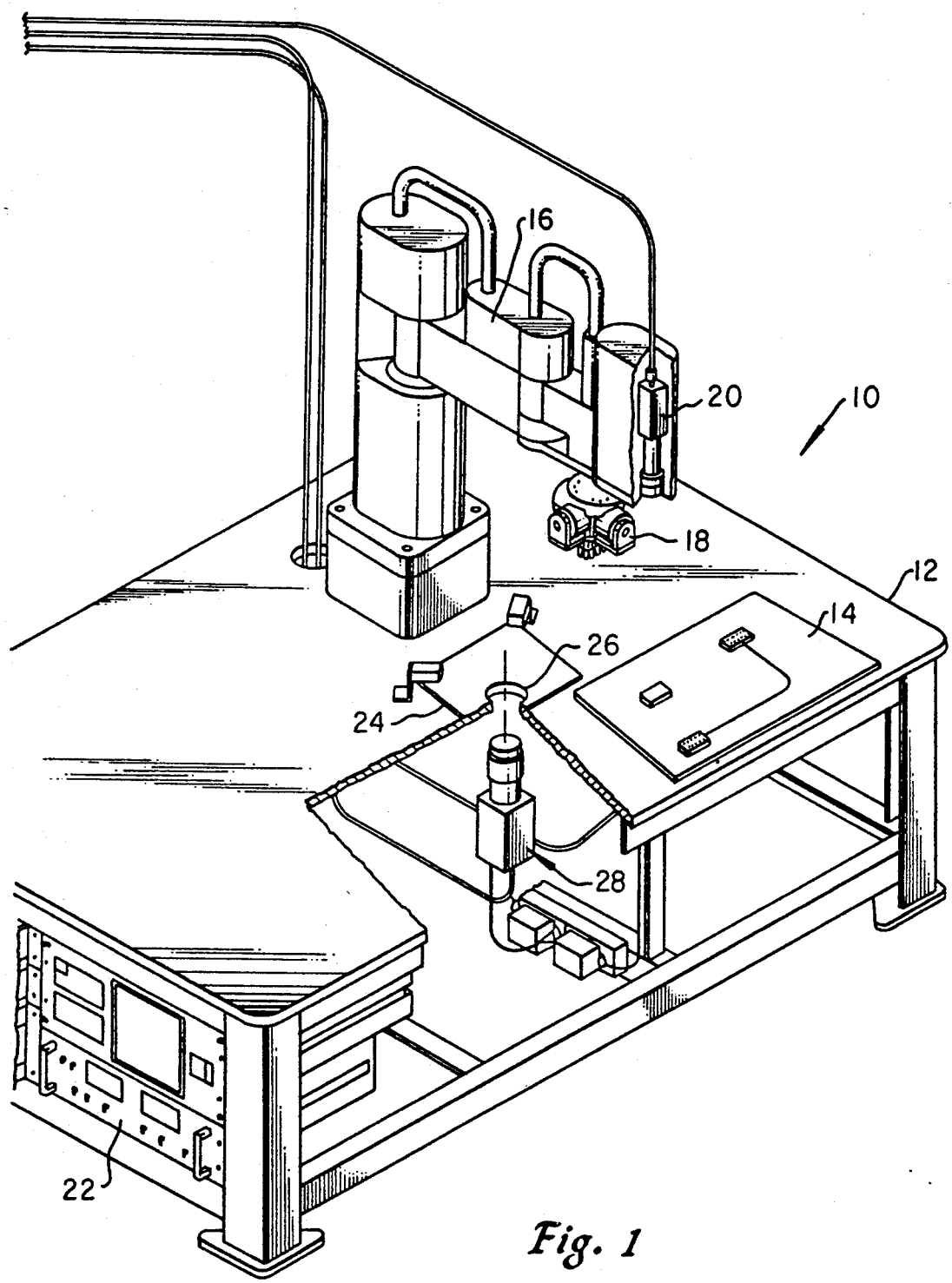
FIG. 1 is a pictorial representation of an integrated circuit inspection and assembly device constructed in accordance with the present invention.

With reference now to the figures and in particular with reference to FIG. 1, there is depicted a pictorial representation of an integrated circuit inspection and assembly device constructed in accordance with the present invention. As is illustrated, inspection and assembly device 10 includes a mounting table 12, Which serves to support the various assembly and inspection areas which are illustrated thereon. For example, circuit board assembly station 14 is illustrated and serves to accurately and rigidly mount a circuit board which will be populated by integrated circuit devices which are assembled utilizing the device as illustrated.

A robotic arm 16 is preferably provided, in accordance With robotic techniques well known in the prior art. Robotic arm 16 serves to mount hot bar thermode tool 18, which will be utilized, in accordance with the method of the present invention, to pick up, hold during inspection and place an integrated circuit device. Also mounted to robotic arm 16 is device placement camera 2, which is utilized to accurately locate a placement site for each integrated circuit device which will be placed in accordance with the method of the present invention.

Situated beneath mounting table 12 are a vacuum pump and various control electronics 22, which are utilized, in accordance with methods well known in the prior art, to control the movement of robotic arm 16 and to provide a vacuum to a vacuum chuck (not illustrated) within hot bar thermode tool 18, so that an integrated circuit device may be selectively and temporarily held therein.

Also depicted on the upper surface of mounting table 12 is inspection station 24. Inspection station 4 is utilized, in accordance with the method of the present invention, to provide an area wherein specific illumination is provided so that an integrated circuit device may be optically inspected. Located within inspection station 24 is inspection aperture 26, which serves to permit inspection camera 28 to focus on an integrated circuit device contained within hot bar thermode tool 18 when hot bar thermode tool 18 is positioned, by means of robotic arm 16, directly above inspection aperture 26.

Figure 2:
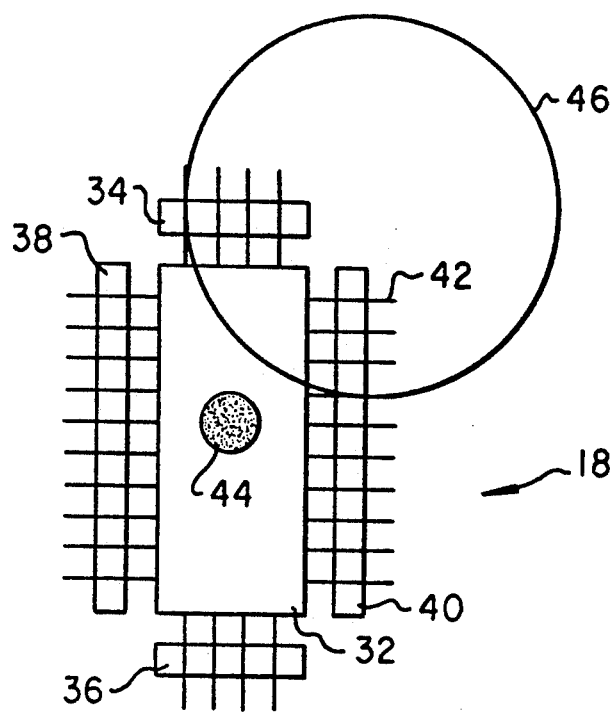
FIG. 2 is a plan view of the bottom of an integrated circuit mounted within the assembly device of FIG. 1.

Referring now to FIG. 2, there is depicted a plane view of the bottom of an integrated circuit which is held within the assembly device of FIG. 1. As is illustrated, an integrated circuit 32 is depicted as held within hot bar thermode tool 18. A vacuum chuck 44 is depicted and is utilized, in a manner well known in the art, in conjunction with a vacuum pump to selectively and temporarily hold integrated circuit 32 within hot bar thermode tool 18.

As is illustrated, hot bar thermode tool 18 includes a plurality of thermally activatable blades 4, 36, 38, and 40 which are, in a preferred embodiment of the present invention electrically thermally activatable in order to assemble integrated circuit device 32 to a circuit board by melting solder in the vicinity of each conductive lead 2. As is depicted in FIG. 2, integrated circuit device 32 includes a plurality of conductive leads 42 which overlay lower surfaces of the plurality of thermally activatable blades present within hot bar thermode tool 18.

Figure 3:
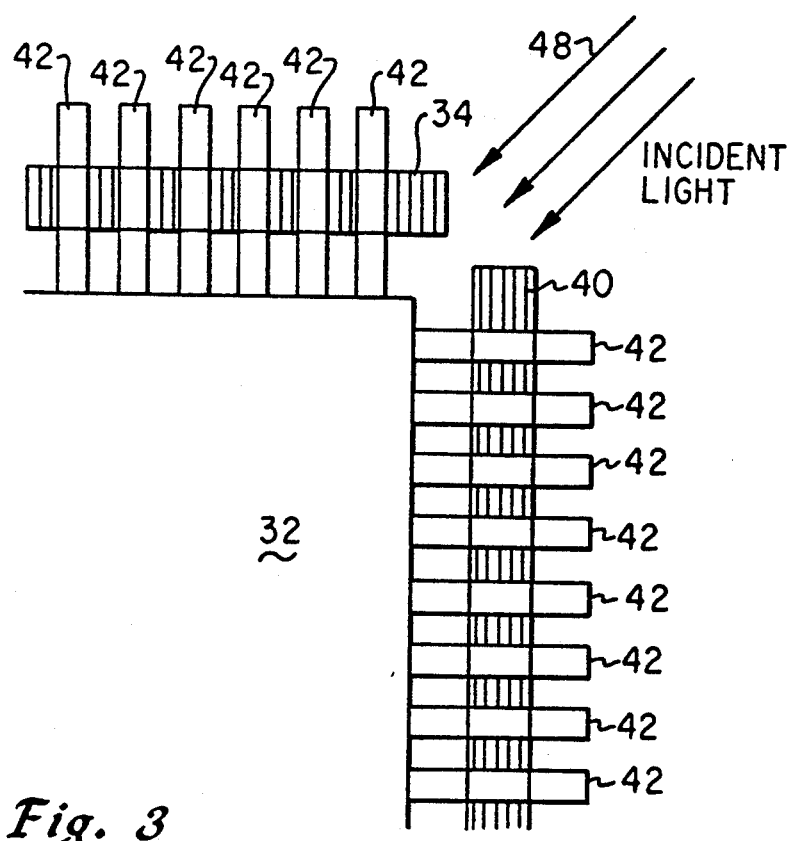
FIG. 3 is an exploded view of a portion of the integrated circuit and assembly device of FIG. 2.

With reference now to FIGS. 2 and 3, area 46 of integrated circuit 32 and hot bar thermode tool 18 is shown in an exploded view within FIG. 3. As is illustrated, a plurality of conductive leads 42, which are electrically connected to selected portions of integrated circuit 32, are positioned in an overlying fashion with respect to the lower surfaces of thermally activatable blades 34 and 40. In accordance with an important feature of one embodiment of the present invention, thermally activatable blades 34 and 40 have been produced with a grained finish in a substantially single direction.

This grained finish is preferably produced by grinding, sanding, lapping or any other grain producing operation. As long as the grain direction on the lower surface of thermally activatable blades 34 and 40 is produced in a single direction, the lower surfaces of thermally activatable blades 34 and 40 will act much like a Fresnel lens and Will have a uniform and minimum specularity, appearing dark.

Conductive leads 42, however, typically constructed of a gold or silver metallic substance, will have a uniform and highly reflective surface, appearing bright. The contrast between the lower surface of thermally activatable 34 and 40 and 42 will be maximized by providing incident light 48 at an angle of between thirty and sixty degrees to the direction of the grain on the lower surfaces of thermally activatable blades 34 and 40.

In a preferred embodiment of the present invention, incident light 48 is applied to the juncture of conductive leads 42 and the grained lower surfaces of thermally activatable blades 34 and 40 at an angle of approximately forty five degrees to the direction of the grain which is placed within the lower surface of thermally activatable blades 34 and 40. In this manner, inspection camera 28 (see FIG. 1) may be utilized to provide an accurate visual inspection of conductive leads 42 while integrated circuit 32 is mounted within hot bar thermode tool 18.

This technique obviates the requirement of inspecting integrated circuit 32 in a first position and then subsequently transferring of integrated circuit 32 to an assembly position by picking the device up and moving it with a different tool. The elimination of this second transfer step renders the system much more efficient by eliminating the possibility that a conductive lead may be bent or damaged during a subsequent transfer of integrated circuit 32.

By inspecting integrated circuit 32 while it is within a mounting tool the efficiency and accuracy of the construction of an electronic system may be greatly enhanced. As utilized herein, the term "hot bar thermode tool" shall mean any device which may be utilized to thermally mount an integrated circuit . device to a circuit board.

Figure 4:
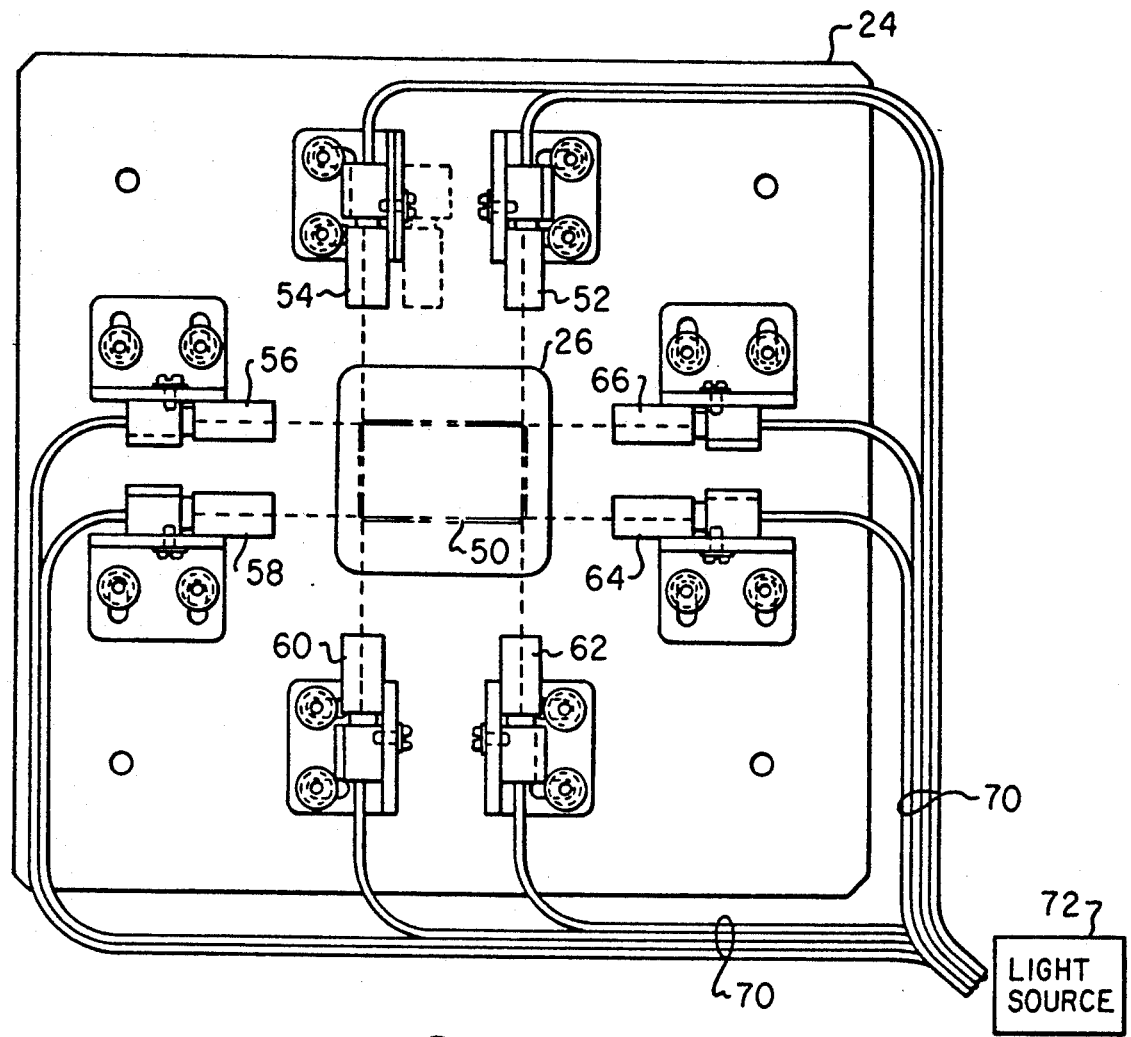
FIG. 4 is a pictorial representation of an inspection site and illumination system which may be utilized with one embodiment of the present invention.

Referring now to FIG. 4, there is depicted a pictorial representation of an inspection site and illumination system which may be utilized in accordance with another embodiment of the present invention. As is illustrated, inspection station 24, as illustrated in FIG. 4, includes an inspection aperture 26 through which inspection camera 28 can provide an accurate optical inspection of conductive leads 42 of integrated circuit device 32 (see FIG. 2).

As illustrated in FIG. 4; an integrated circuit device profile 50 is depicted within inspection aperture 26 and is generally rectangular or square in shape. As those skilled in the art will appreciate upon reference to FIG. 2, integrated circuit devices of the type utilized in high density electronic systems typically have a plurality of conductive leads disposed along all four sides of a circuit device. In accordance with an important feature of this embodiment of the present invention a plurality of light stations 52, 54, 56, 58, 60, 62, 64, and 66 are provided.

Each of the aforementioned light station cooperates, as illustrated in FIG. 4, with a second light station which is disposed on a line opposite to its cooperating light station. That is, light station 54 cooperates with 60 to illuminate the left hand edge of integrated circuit device profile 50. Similarly, light station 52 cooperates with light station 62 to illuminate the right hand edge of integrated circuit device profile 50, and so on.

In this manner, each edge of an integrated circuit device can be thoroughly illuminated by utilizing the plurality of light inspection stations depicted. In the depicted embodiment of the present invention, each light station preferably comprises a dual stacked light with two sources of light focused utilizing bi-convex lenses projecting oval patterns. Each light is preferably focused at an intermediate point along one of the thermally activatable blades of hot bar thermode tool 18 (see FIG. 2) such that the conductive leads 42 disposed adjacent thereto will be illuminated.

By focusing the output of each light station at a low angle with respect to the plane wherein integrated circuit 32 (see FIG. 2) is mounted the contrast between conductive leads 42 and each thermally activatable blade of hot bar thermode tool 18 may be enhanced by projecting a shadow on those portions of each thermally activatable blade which are exposed between adjacent conductive leads 42. This technique will be illustrated in greater detail in FIG. 5 herein.

In accordance with another important aspect of the present invention, it can be seen in FIG. 4 that each light station mounted therein is connected via a fiber optic cable 70 to a light source 72. By utilizing equal length fiber optic cables 70 and a single light source 72, the amount of illumination which is focused on each group of conductive leads 42 will preferably be substantially equal. In this manner, the threshold levels which are utilized by inspection camera 28 to detect the presence or absence of a conductive lead may be accurately set for each edge of integrated circuit device 32.

Figure 5:
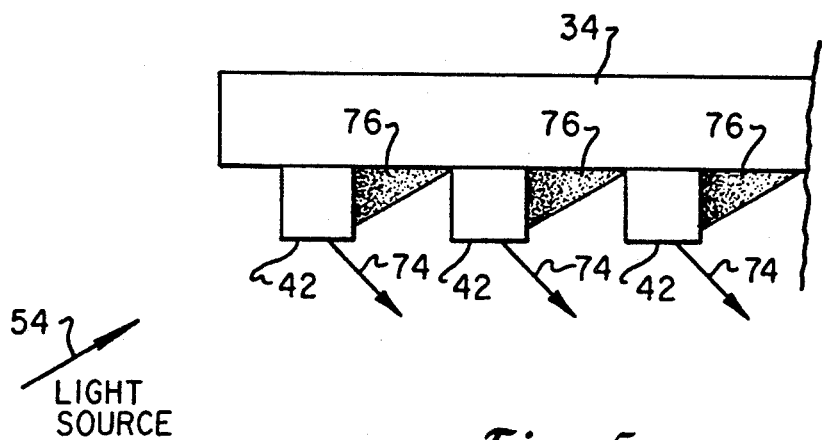
FIG. 5 is a partial side view of an integrated circuit device mounted and illuminated in accordance with the embodiment of FIG. 4.

Finally with reference to FIG. 5, there is depicted a partial side view of an integrated circuit device which is mounted and illuminated in accordance with the embodiment of FIG. 4. As is illustrated, a plurality of conductive leads 42 are disposed in an overlying relationship with thermally activatable blade 34 of hot bar thermode tool 18. A low angle light source 54, such as provided by light station 54, is then utilized to illuminate conductive leads 42. Due to the fact that conductive leads 42 are typically constructed of a gold or silver material and are highly reflective in nature, a great deal of light will be reflected from the surface of each conductive lead 42, as illustrated at reference numerals 74.

Additionally, a shadowed area 76 is provided on the lower surface of thermally activatable blade 34 of hot bar thermode tool 18 by the presence of each conductive lead 42. Thus, it should be obvious that by the provision of a low angle source of illumination, relative to the plane in which integrated circuit 32 is mounted, the resultant shadows on each thermally activatable blade of hot bar thermode tool 18 may be utilized to provide a high degree of contrast between each conductive lead 42 an underlying thermally activatable blade.

As a result, a highly accurate optical inspection of conductive leads 42 may be obtained while integrated circuit device 32 is mounted within hot bar thermode tool 18. In a preferred embodiment of the present invention each light station of inspection station 24 of FIG. 4 is mounted so as to focus a beam of light on conductive leads 42 of integrated circuit device 32 at an angle of between ten and thirty degrees with respect to the plane in which integrated circuit device 32 is mounted.

In summary, the Applicants have provided a novel and unique method and apparatus whereby the conductive leads of an integrated circuit device may be accurately and efficiently optically inspected while an integrated circuit device is mounted within a mounting tool, such as hot bar thermode tool 18. By inspecting the conductive leads of an integrated circuit device while the device is present within a mounting tool, the possibility of further damage to the conductive leads prior to mounting the integrated circuit device on a circuit board are substantially eliminated.

While the invention has been particularly shown and described with reference to a preferred embodiment, it will be understood by those skilled in the art that various changes in form and detail may be made therein without departing from the spirit and scope of the invention.

We claim:

1. An apparatus for inspecting conductive leads of an integrated circuit device, said apparatus comprising:

a hot bar thermode having a plurality of thermally activatable blades adapted to bond the conductive leads of an integrated circuit device to a mounting surface, each of said plurality of thermally activatable blades having a lower surface;

means for selectively mounting an integrated circuit device in a first plane adjacent to said hot bar thermode wherein a plurality of groups of elongate parallel conductive leads of said integrated circuit device are disposed adjacent to said lower surfaces of said plurality of thermally activatable blades;

illuminating means disposed adjacent to said hot bar thermode on a first side of said first plane for illuminating said conductive leads adjacent to said lower surface of said thermally activatable blades at a low angle relative to said first plane and at an angle of at least forty-five degrees to each of said plurality of groups of elongate parallel conductive leads herein said conductive leads are illuminated and said lower surfaces of said plurality of thermally activatable blades adjacent said conductive leads are shadowed; and visual inspection means disposed on said first side of said first plane for performing a visual inspection of said plurality of groups of elongate parallel conductive leads.

2. The apparatus for inspecting conductive leads of an integrated circuit device according to claim 2, wherein said illuminating means comprises at least two sources of light focused at low angles relative to said first plane at said conductive leads.

3. The apparatus for inspecting conductive leads of an integrated circuit device according to claim 1, wherein said illuminating means comprises at least two sources of light on opposite sides of said integrated circuit device focused at low angles relative to said first plane on a single line along each of said at least two edges of said rectangular shape.

4. The apparatus for inspecting conductive leads of an integrated circuit device according to claim 1, wherein said means for selectively mounting an integrated circuit device adjacent to said hot bar thermode comprises a vacuum chuck and means for selectively activating an associated vacuum pump.

5. The apparatus for inspecting conductive leads of an integrated circuit device according to claim 1, wherein said illuminating means comprises a single source of light and a plurality of fiber optic cables for focusing a plurality of beams of light at low angles relative to said first plane wherein said conductive leads may be illuminated from multiple positions.

6. The apparatus for inspecting conductive leads of an integrated circuit device according to claim 1, wherein said visual inspection means comprises a camera disposed below said hot bar thermode for providing an image of said conductive leads.

7. An apparatus for inspecting conductive leads of an integrated circuit device, said apparatus comprising:

a hot bar thermode having a plurality of thermally activatable blades adapted to bond the conductive leads of an integrated circuit device to a mounting surface, each of said plurality of thermally activatable blades having a lower surface having a grained finish with a grain in a single direction;

means for selectively mounting an integrated circuit device in a first plane adjacent to said hot bar thermode wherein the conductive leads of said integrated circuit device are disposed adjacent to said lower surface of said plurality of thermally activatable blades;

illuminating means disposed adjacent to said hot bar thermode on a first side of said first plane for illuminating said conductive leads adjacent to said lower surfaces of said plurality of thermally activatable blades at a selected angle with respect to said single direction wherein a high contrast is created between said conductive leads and said lower surfaces of said plurality of thermally activatable blades; and visual inspection means disposed of said first side of said first plane for performing visual inspection of said conductive leads.

8. The apparatus for inspecting conductive leads of an integrated circuit device according to claim 7, wherein said illuminating means comprises at least one sources of light focused at said conductive leads at an angle of between thirty and sixty degrees from said single direction.

9. The apparatus for inspecting conductive leads of an integrated circuit device according to claim 7, wherein said means for selectively mounting an integrated circuit device adjacent to said hot bar thermode comprises a vacuum chuck and means for selectively activating an associated vacuum pump.

10. The apparatus for inspecting conductive leads of an integrated circuit device according to claim 7, wherein said visual inspection means comprises a camera disposed below said hot bar thermode for providing an image of said conductive leads.

* * * * *

UNITED STATES PATENT AND TRADEMARK OFFICE
CERTIFICATE OF CORRECTION

PATENT NO.   : 5,257,714

DATED        : 2 November 1993

INVENTOR(S)  : Gregory E. Beers, et al.

It is certified that error appears in the above-identified patent and that said Letters Patent is hereby corrected as shown below:

Column 2, line 67, please change "With" to --with--.

Column 3, line 37, please change "4" to --34--.

Signed and Sealed this

Seventeenth Day of May, 1994

Attest:

BRUCE LEHMAN

Attesting Officer

Commissioner of Patents and Trademarks